United States Patent
Ibusuki et al.

(10) Patent No.: US 8,184,407 B2
(45) Date of Patent: May 22, 2012

(54) MAGNETORESISTANCE EFFECT DEVICE, MAGNETIC LAMINATION STRUCTURAL BODY, AND MANUFACTURE METHOD FOR MAGNETIC LAMINATION STRUCTURAL BODY

(75) Inventors: Takahiro Ibusuki, Kawasaki (JP); Masashige Sato, Kawasaki (JP); Shinjiro Umehara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1115 days.

(21) Appl. No.: 12/041,396

(22) Filed: Mar. 3, 2008

(65) Prior Publication Data

US 2008/0232003 A1 Sep. 25, 2008

(30) Foreign Application Priority Data

Mar. 20, 2007 (JP) .................. 2007-072280

(51) Int. Cl.
*G11B 5/33* (2006.01)
(52) U.S. Cl. .................... 360/324; 360/324.11
(58) Field of Classification Search ............ 360/324, 360/324.11
See application file for complete search history.

(56) References Cited

U.S. PATENT DOCUMENTS

| | | | |
|---|---|---|---|
| 6,303,218 B1 | 10/2001 | Kamiguchi et al. | |
| 6,495,275 B2 | 12/2002 | Kamiguchi et al. | |
| 7,333,302 B2 * | 2/2008 | Lee et al. | 360/324.1 |
| 2006/0158791 A1 * | 7/2006 | Lee et al. | 360/324.1 |

FOREIGN PATENT DOCUMENTS

| | | |
|---|---|---|
| JP | 11-329882 A | 11/1999 |
| JP | 2000-156530 A | 6/2000 |
| JP | 2005-244254 | 9/2005 |

OTHER PUBLICATIONS

David D. Djayaprawira et al., "230% room-temperature magnetoresistance in CoFeB/MgO/CoFeB magnetic tunnel junctions", Applied Physics Letters. 86, 092502 (2005).
Japanese Office Action dated Aug. 30, 2011, issued in corresponding Japanese Patent Application No. 2007-072280.

* cited by examiner

Primary Examiner — Daniell L Negron
Assistant Examiner — Carlos E Garcia
(74) Attorney, Agent, or Firm — Westerman, Hattori, Daniels & Adrian, LLP

(57) ABSTRACT

An underlying layer (2) made of NiFeN is disposed over the principal surface of a substrate. A pinning layer (3) made of antiferromagnetic material containing Ir and Mn is disposed on the underlying layer. A reference layer (4c) made of ferromagnetic material whose magnetization direction is fixed through exchange-coupling with the pinning layer directly or via another ferromagnetic material layer, is disposed over the pinning layer. A nonmagnetic layer (7) made of nonmagnetic material is disposed over the reference layer. A free layer (8) made of ferromagnetic material whose magnetization direction changes in dependence upon an external magnetic field, is disposed over the nonmagnetic layer.

15 Claims, 13 Drawing Sheets

MAGNETORESISTANCE EFFECT DEVICE, MAGNETIC LAMINATION STRUCTURAL BODY, AND MANUFACTURE METHOD FOR MAGNETIC LAMINATION STRUCTURAL BODY

CROSS REFERENCE TO RELATED APPLICATION

This application is based on and claims priority of Japanese Patent Application No. 2007-072280 filed on Mar. 20, 2007, the entire contents of which are incorporated herein by reference.

BACKGROUND OF THE INVENTION

A) Field of the Invention

The present invention relates to a magnetoresistance effect device having a pinning layer made of antiferromagnetic material containing Ir and Mn, a magnetic lamination structural body and a manufacture method for a magnetic lamination structural body.

B) Description of the Related Art

An exchange coupling film having a lamination structure consisting of an antiferromagnetic film and a ferromagnetic film is used to fix a magnetization direction of a ferromagnetic film used in a reading device of a hard disk drive (HDD) or a magnetoresistance effect type random access memory (MRAM).

FIG. 12 is a partial perspective view of a HDD reading device and a magnetic recording medium. An xyz orthogonal coordinate system is defined, xy-plane being defined on the surface of a magnetic recording medium 103 and z-axis being perpendicular to the surface of a magnetic recording medium 103. It is assumed that the x-axis direction corresponds to a trailing direction and the y-axis direction corresponds to a track width direction. A pair of magnetic shielding layers 100 and 101 is disposed at a distance from each other in the x-axis direction. A magnetoresistance effect device 102 is disposed between the magnetic shielding layers. The magnetoresistance effect device 102 faces the magnetic recording medium 103 with a micro gap therebetween in the z-axis direction. For example, a tunneling magnetoresistance effect device (TMR device) or a spin valve film is used as the magnetoresistance effect device 102.

A TMR device has a lamination structure of, for example, an underlying layer, an antiferromagnetic pinning layer, a ferromagnetic reference layer, a tunneling barrier layer, a free layer, and a cap layer stacked in the x-axis direction. A magnetic field generated from the magnetic recording medium 103 is sensed by the free layer of the magnetoresistance effect device 102, and a change in the magnetic field is read as an electric signal.

The pair of magnetic shielding layers 100 and 101 has a role of absorbing a magnetic field from bits adjacent to a target bit to be read. A bit length Lb depends therefore upon a total thickness (read gap length) Lrg of the magnetoresistance effect device 102. As the read gap length Lrg becomes long, the bit length Lb becomes long. It is desired to shorten the read gap length Lrg in order to shorten the bit length Lb.

Until the year of 2003, a Ta/NiFe laminated layer, a Ta/Ru laminated layer, a NiCr layer or a NiFeCr layer has been used as the underlying layer of a reading device for a HDD, and a PtMn layer or a PdPtMn layer has been used as the antiferromagnetic pinning layer. However, the antiferromagnetic pinning layer is required to have a thickness of 15 nm or thicker, in order for the antiferromagnetic pinning layer to be exchange-coupled with the ferromagnetic reference layer. As the pinning layer becomes thick, the read gap length Lrg becomes long. It is therefore difficult to improve a recording density by shortening the bit length Lb.

If IrMn is used for the pinning layer, the pinning layer is exchange-coupled with the pinned layer even if the pinning layer is thinned to about 4 nm. A magnetoresistance effect device using IrMn for the pinning layer is therefore suitable for improving a recording density (for example, refer to JP-A-2005-244254).

In order to exhibit the performance of a TMR device using MgO for the tunneling barrier layer at the maximum, it is preferable to make MgO have a (2 0 0) orientation. MgO can be made to have the (2 0 0) orientation by using amorphous CoFeB for the reference layer serving as the underlying layer of the tunneling barrier layer (refer to David D. Djayaprawira et al., "230% room-temperature magnetoresistance in CoFeB/MgO/CoFeB magnetic tunnel junctions". Appl. Phys. Lett., 86, 092502 (2005)).

If IrMn is used for the pinning layer of a TMR device, a surface flatness of the pinning layer is degraded (surface roughness is increased). If the tunneling barrier layer is made thin to lower an area resistance RA of the TMR device, magnetostatic interaction between the reference layer and magnetization free layer becomes large because of surface irregularity of the reference layer. Therefore, a magnetization direction of the magnetization free layer is affected by magnetization of the reference layer. If the tunneling barrier layer of MgO is thin, pin holes are generated in the tunneling barrier layer because of surface irregularity of the reference layer, and the device performance may be degraded.

When the reference layer as the underlying layer of the tunneling barrier layer of MgO is made of amorphous CoFeB, MgO having a good (2 0 0) orientation can be obtained if the MgO film is grown to some thickness. However, if the MgO film is thin, it is difficult to form a film having a sufficient (2 0 0) orientation. As the orientation of the MgO film is degraded, an MR ratio lowers.

SUMMARY OF THE INVENTION

According to an aspect of an embodiment, there is a magnetoresistance effect device that includes:

an underlying layer made of NiFeN and disposed on a principal surface of a substrate;

a pinning layer made of antiferromagnetic material containing Ir and Mn and disposed on the underlying layer;

a reference layer disposed on the pinning layer and made of ferromagnetic material whose magnetization direction is fixed through exchange-coupling with the pinning layer directly or via another ferromagnetic material layer;

a nonmagnetic layer made of nonmagnetic material and disposed on the reference layer; and a free layer disposed on the nonmagnetic layer and made of ferromagnetic material whose magnetization direction changes under an influence of an external magnetic field.

According to an aspect of another embodiment, there is a magnetic lamination structural body that includes:

an underlying layer made of NiFeN and disposed on a principal surface of a substrate;

a pinning layer made of antiferromagnetic material containing Ir and Mn and disposed on the underlying layer; and a pinned layer disposed on the pinning layer and made of ferromagnetic material whose magnetization direction is fixed through exchange-coupling with the pinning layer.

According to an aspect of further another embodiment, there is a manufacture method for a magnetic lamination structural body that includes:

forming an underlying layer of NiFeN on a substrate by reactive sputtering using an NiFe target and nitrogen-containing gas as sputtering gas; and forming a pinning layer made of antiferromagnetic material containing Ir and Mn, on the underlying layer.

According to an aspect of further another embodiment, there is a magnetoresistance effect device that includes:

an underlying layer made of NiFeN and disposed on a principal surface of a substrate;

a free layer disposed on the underlying layer and made of ferromagnetic material whose magnetization direction changes under an influence of an external magnetic field;

a tunneling barrier layer disposed on the free layer and made of MgO; and a reference layer disposed on the tunneling barrier layer and made of ferromagnetic material whose magnetization direction is fixed.

DESCRIPTION OF THE PREFERRED EMBODIMENTS

Figure 1:
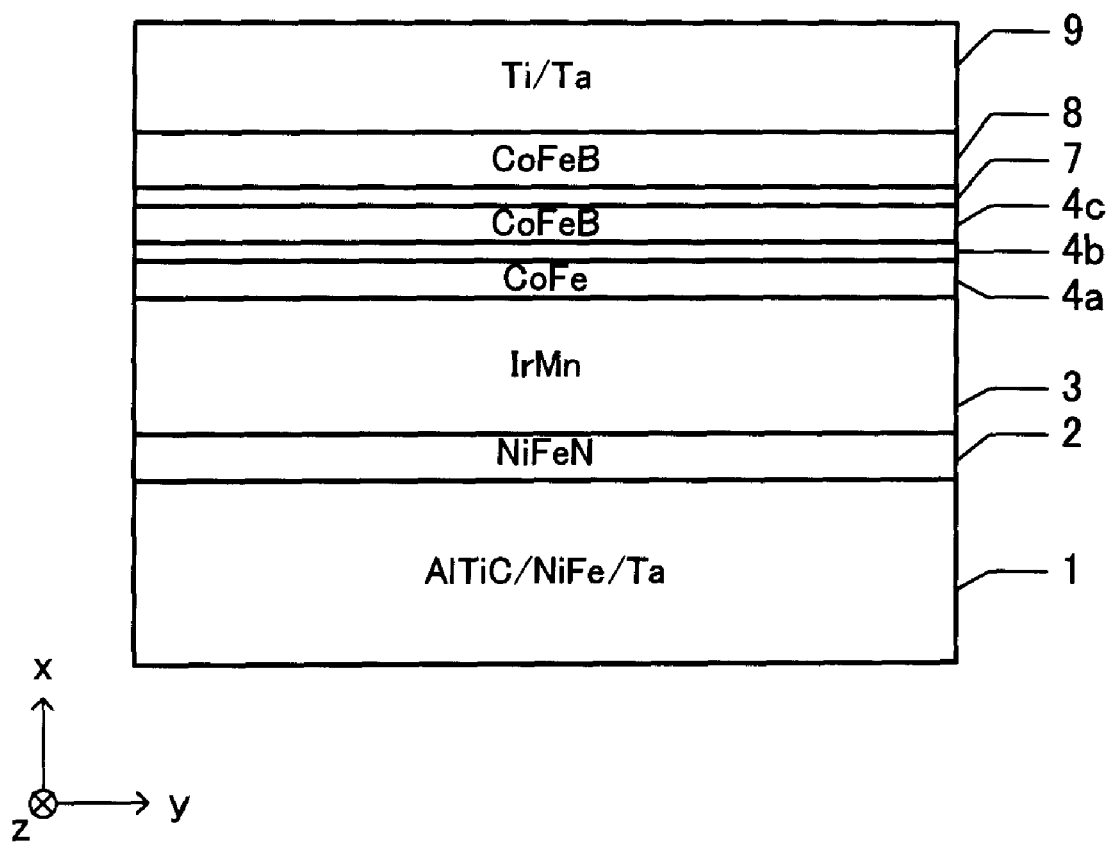
FIG. 1 is a cross sectional view of a magnetoresistance effect device according to a first embodiment.

FIG. 1 is a cross sectional view of a magnetoresistance effect device according to the first embodiment. On a support substrate 1, an underlying layer 2, a pinning layer 3, a pinned layer 4a, a nonmagnetic intermediate layer 4b, a reference layer 4c, a tunneling barrier layer (nonmagnetic layer) 7, a free layer 8 and a cap layer 9 are stacked in this order. For example, the support substrate 1 has a lamination structure that a NiFe layer and a Ta layer are laminated in this order on an $Al_2O_3$—TiC substrate.

The underlying layer 2 is made of NiFeN and has a thickness of 3 nm, for example. The NiFeN film can be formed by reactive sputtering using NiFe as a target and using Ar and $N_2$ as sputtering gas. A target of Ni and Fe added with a third element may be used. A usable third element may be Co, Cr, Cu or the like. This film may be formed by cosputtering. The pinning layer 3 is made of IrMn and has a thickness of 7 nm, for example.

The pinned layer 4a is made of ferromagnetic material such as CoFe and has a thickness of 1.7 nm, for example. The nonmagnetic intermediate layer 4b is made of nonmagnetic material such as Ru and has a thickness of 0.68 nm, for example. The reference layer 4c is made of CoFeB and has a thickness of 2.5 nm, for example. The pinned layer 4a is exchange-coupled with the pinning layer 3 so that a magnetization direction of the pinned layer 4a is fixed. The pinned layer 4a and the reference layer 4c are exchange-coupled with each other via the nonmagnetic intermediate layer 4b in such a manner that the magnetization direction of the pinned layer 4a and a magnetization direction of the reference layer 4c are antiparallel to each other. Namely, the reference layer 4c is indirectly exchange-coupled with the pinning layer 3 via the pinned layer 4a. A three-layer structure from the pinned layer 4a to the reference layer 4c constitutes a synthetic ferri-pinned layer 4.

A ferromagnetic reference layer consisting of a single layer may be used in place of the synthetic ferri-pinned layer. In this case, the reference layer is directly exchange-coupled with the pinning layer 3.

The tunneling barrier layer 7 is made of insulating material such as MgO and has a thickness of 1.0 to 1.5 nm, for example, allowing a tunneling current to flow in a thickness direction. The free layer 8 is made of ferromagnetic material such as CoFeB and has a thickness of 3 nm, for example. The cap layer 9 is made of nonmagnetic material, and for example, has a two-layer structure of a Ti layer of 5 nm in thickness and a Ta layer of 10 nm in thickness. Each layer between the pinning layer 3 and the cap layer 9 is formed, for example, by sputtering.

Figure 2A:
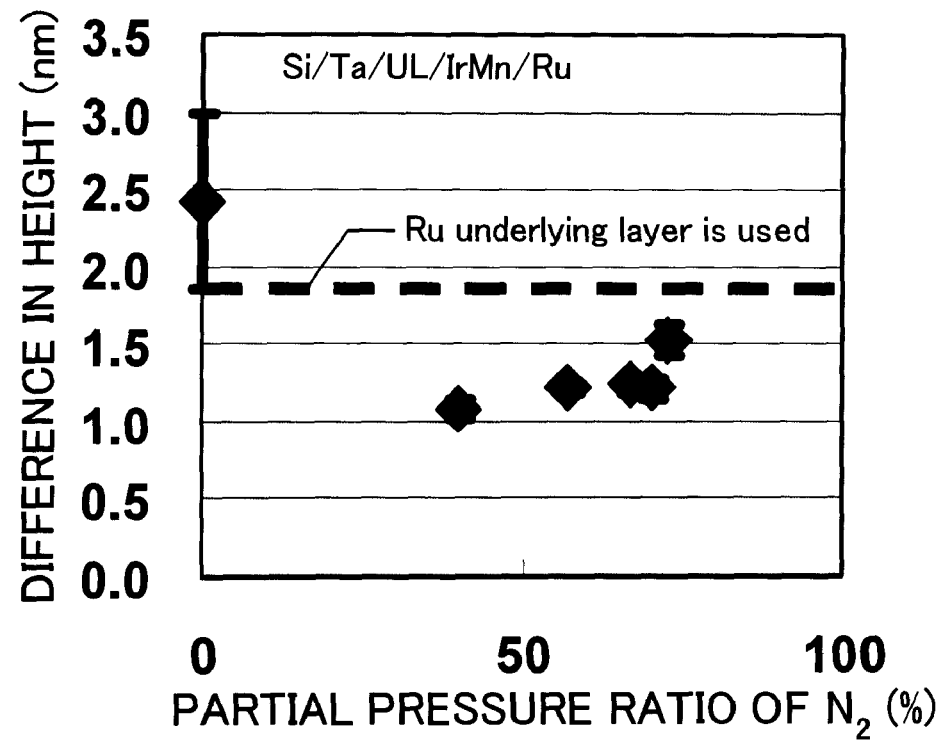
FIG. 2A is a graph showing a relation between a difference in height on a surfaces of an IrMn layer and a partial pressure of nitrogen gas while an underlying layer is formed.
Figure 2B:
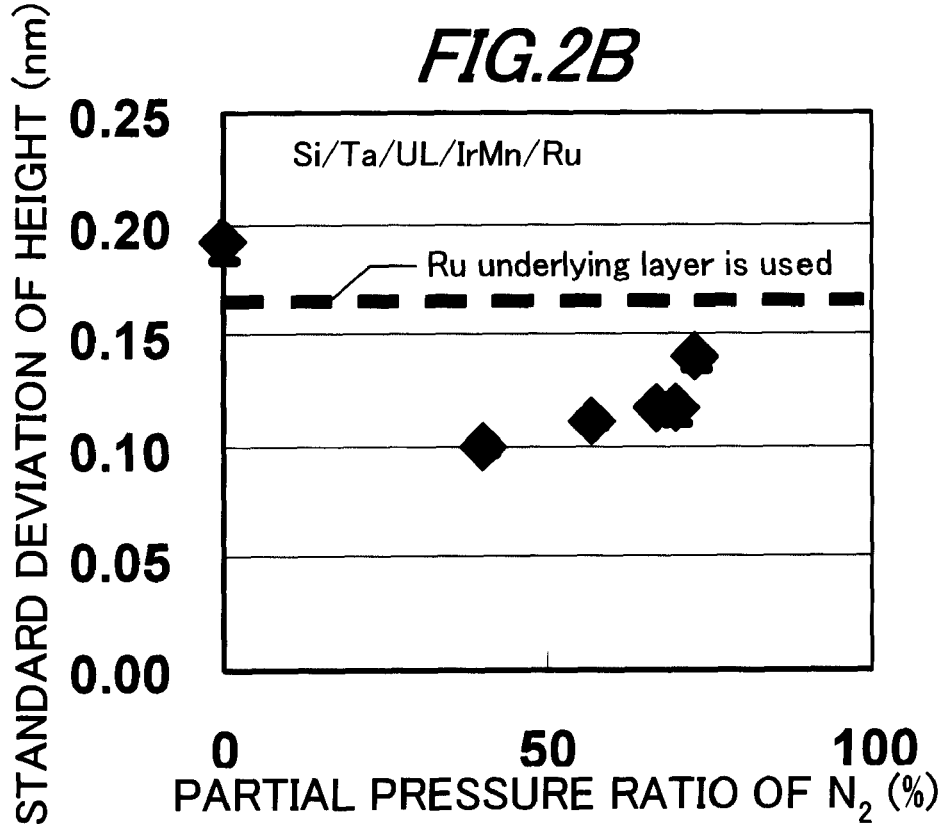
FIG. 2B is a graph showing a relation between a standard deviation of a surface height of an IrMn layer and a partial pressure of nitrogen gas while the underlying layer is formed.

With reference to FIGS. 2A and 2B, description will be made on the effect of improving a flatness of the surface of the pinning layer 3. Samples were formed by etching the surface of a silicon substrate to planarize the surface, and sequentially forming on the silicon substrate a Ta layer having a thickness of 3 nm, an underlying layer of NiFeN having a thickness of 4 nm, an IrMn layer having a thickness of 7 nm and an Ru layer having a thickness of 1 nm by sputtering. The underlying layer is formed by sputtering using mixture gas of Ar and $N_2$ as sputtering gas. A plurality of samples were formed under conditions of various partial pressure ratio of $N_2$. For the purposes of comparison, samples using a Ru underlying layer and a NiFe underlying layer were formed. The NiFe underlying layer is formed under a condition that a partial pressure ratio of nitrogen gas to sputtering gas is set to 0.

FIGS. 2A and 2B show a difference in height of the surface of the uppermost Ru layer of each sample and a standard deviation of height of the surface of each sample. The difference in height was measured with an atomic force microscope. The abscissas of FIGS. 2A and 2B represent a nitrogen gas partial pressure ratio during underlying layer formation in the unit of "%", the ordinate of FIG. 2A represents a difference in height in the unit of "nm", and the ordinate of FIG. 2B represents a standard deviation of height in the unit of "nm". The difference in height and standard deviation of height of the sample using the Ru underlying layer are indicated by broken lines.

It can be understood that the surface flatness is improved by using NiFeN for the underlying layer as compared to by using Ru or NiFe. Although it has been demonstrated that the flatness is improved at a nitrogen gas partial pressure ratio of 30 to 75% during underlying layer formation, a higher flatness than that of the sample using the NiFe underlying layer can be obtained even at a nitrogen gas partial pressure ratio higher than 0% and lower than 30%.

Next, with reference to FIGS. 3A and 3B, description will be made on the improvement effect of a MR ratio. As the support substrate 1 shown in FIG. 1, a substrate was prepared which was formed by etching the surface of a silicon substrate to planarize the surface, and depositing on the substrate a Ta layer having a thickness of 5 nm, a CuN layer having a thickness of 20 nm, a Ta layer having a thickness of 3 nm, a CuN layer having a thickness of 20 nm and a Ta layer having a thickness of 3 nm. Formed on this substrate were an underlying layer 2 of NiFeN having a thickness of 3 nm, a pinning layer 3 of IrMn having a thickness of 7 nm, a pinned layer 4a of CoFe having a thickness of 1.7 nm, a nonmagnetic intermediate layer 4b of Ru having a thickness of 0.68 nm, a reference layer 4c of CoFeB having a thickness of 2.5 nm, a tunneling barrier layer 7 of MgO having a thickness of 1.0 to 1.5 nm, and a free layer 8 of CoFeB having a thickness of 3 nm. The cap layer 9 had a three-layer structure of a Ta layer having a thickness of 5 nm, a Cu layer having a thickness of 10 nm and an Ru layer having a thickness of 10 nm. A plurality of samples were formed having different area resistances RA, by changing a film thickness of the tunneling barrier layer 4b. For the purposes of comparison, samples having a Ru underlying layer 2 and a NiFe underlying layer 2 were formed.

Figure 3A:
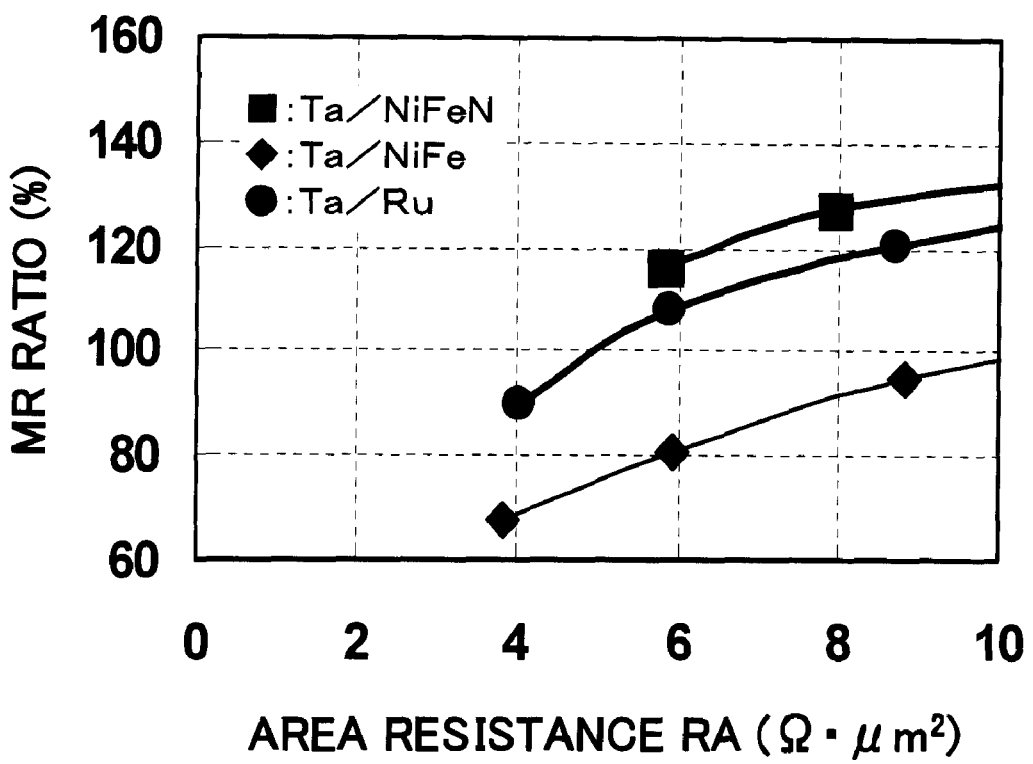
FIG. 3A is a graph showing a relation between an MR ratio and an area resistance RA of TMR devices in which NiFeN, NiFe and Ru are used as the underlying layer of the pinning layer of IrMn.

FIG. 3A shows a relation between an MR ratio and an area resistance RA. The abscissa represents an area resistance RA in the unit of "$\Omega \cdot \mu m^2$", and the ordinate represents an MR ratio in the unit of "%". Square, rhomboid and circle symbols in FIG. 3A correspond to the samples using NiFeN, NiFe and Ru for the underlying layer 2, respectively. A larger MR ratio can be obtained by using NiFeN for the underlying layer 2 than by using NiFe and Ru.

Figure 3B:
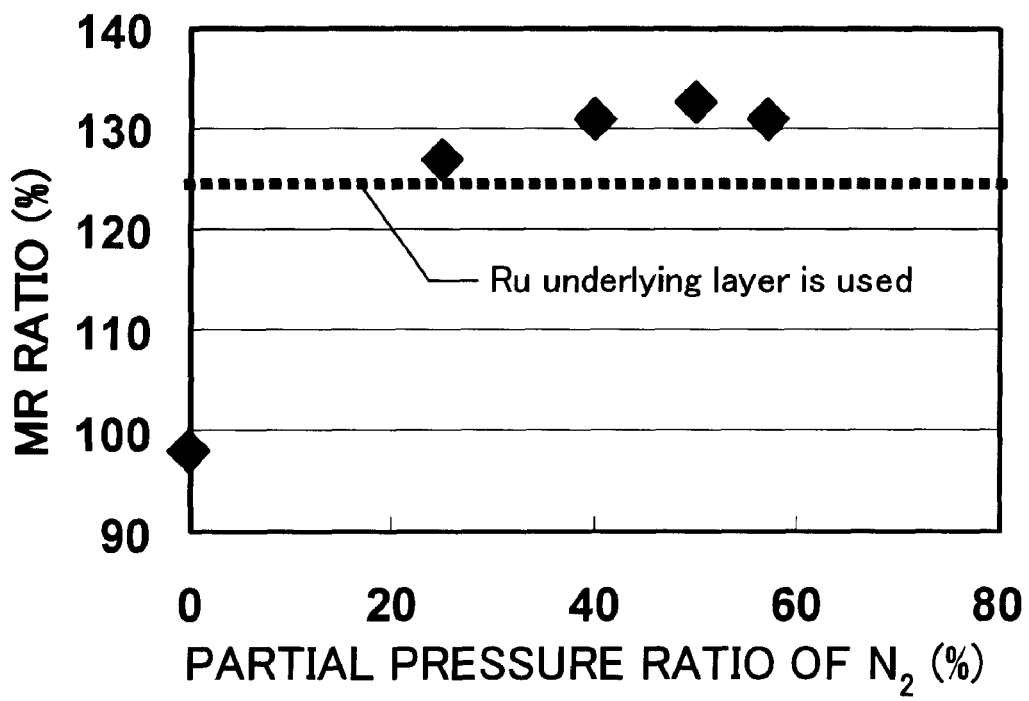
FIG. 3B is a graph showing a relation between an MR ratio and a partial pressure ratio of nitrogen gas to sputtering gas during the formation of the underlying layer.

FIG. 3B shows a relation between an MR ratio and a partial pressure ratio of nitrogen gas to sputtering gas during the formation of the underlying layer 2. The abscissa represents a nitrogen gas partial pressure ratio in the unit of "%", and the ordinate represents an MR ratio in the unit of "%". A plurality of samples were formed by adjusting a thickness of the tunneling barrier layer 7 so that the area resistance RA is 10 $\Omega \cdot \mu m^2$. For the purposes of comparison, an MR ratio of the sample using the Ru underlying layer 2 is indicated by a broken line. The sample at the nitrogen gas partial pressure ratio of 0% uses the NiFe underlying layer 2.

The sample using NiFeN for the underlying layer 2 has a higher MR ratio than that of the samples using NiFe and Ru for the underlying layer 2. It has been demonstrated that a high MR ratio can be obtained in a range of the nitrogen gas partial pressure ratio between 25% and 60%.

Improvement in the MR ratio using NiFeN for the underlying layer 2 may be considered resulting from an improved flatness of each layer over the underlying layer.

Next, with reference to FIGS. 4A and 4B, description will be made on a suitable range of a thickness of the underlying layer 2. Samples were formed having NiFeN underlying layers 2 of 2 nm, 3 nm, 4 nm and 5 nm in thickness. The lamination structure is the same as that of the samples used for evaluation in FIG. 3A. A sample having the underlying layer 2 of 1 nm in thickness did not have exchange-coupling between the pinning layer 3 of IrMn and the pinned layer 4a of CoFe, and the magnetization direction of the pinned layer 4a was unable to be fixed. Samples having different area resistances RA were formed by changing a thickness of the tunneling barrier layer 7 in the range between 1.0 nm and 1.5 nm. For the purposes of comparison, a sample using Ru for the underlying layer 2 was formed.

Figure 4A:
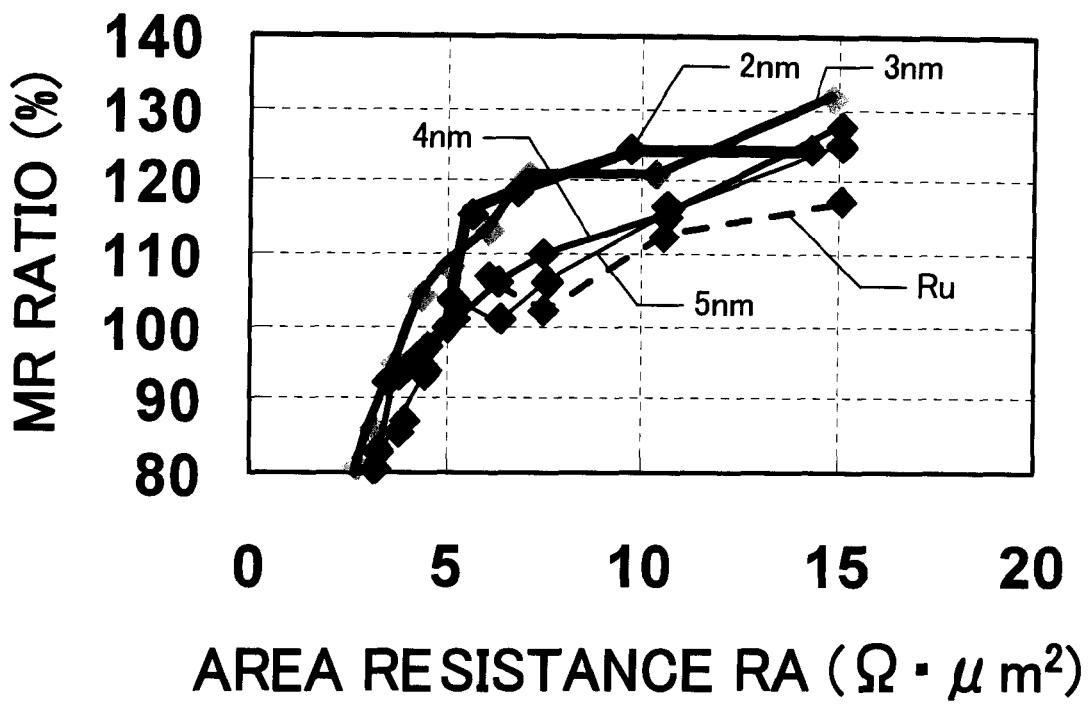
FIG. 4A is a graph showing a relation between an MR ratio and an area resistance RA of a plurality of samples having different thicknesses of an NiFeN film, which is used as the underlying layer of a pinning layer of IrMn.

FIG. 4A shows a relation between an MR ratio and an area resistance RA. The abscissa represents an area resistance RA in the unit of "$\Omega \cdot \mu m^2$", and the ordinate represents an MR ratio in the unit of "%". A numerical value added to each polygonal line in FIG. 4A indicates a thickness of the underlying layer 2. For the purposes of comparison, an MR ratio of the sample using the Ru underlying layer 2 is indicated by a broken line. At the thicknesses of 2 and 3 nm of the underlying layers 2, a MR ratio of each of the samples having area resistances RA in a range between 5 $\Omega \cdot \mu m^2$ and 15 $\Omega \cdot \mu m^2$ was higher than that of the sample using the Ru underlying layer. At the thicknesses of 4 and 5 nm, an MR ratio of each of the samples having area resistances RA in a range between 7.5 $\Omega \cdot \mu m^2$ to 15 $\Omega \cdot \mu m^2$ was higher than that of the sample using the Ru underlying layer.

Figure 4B:
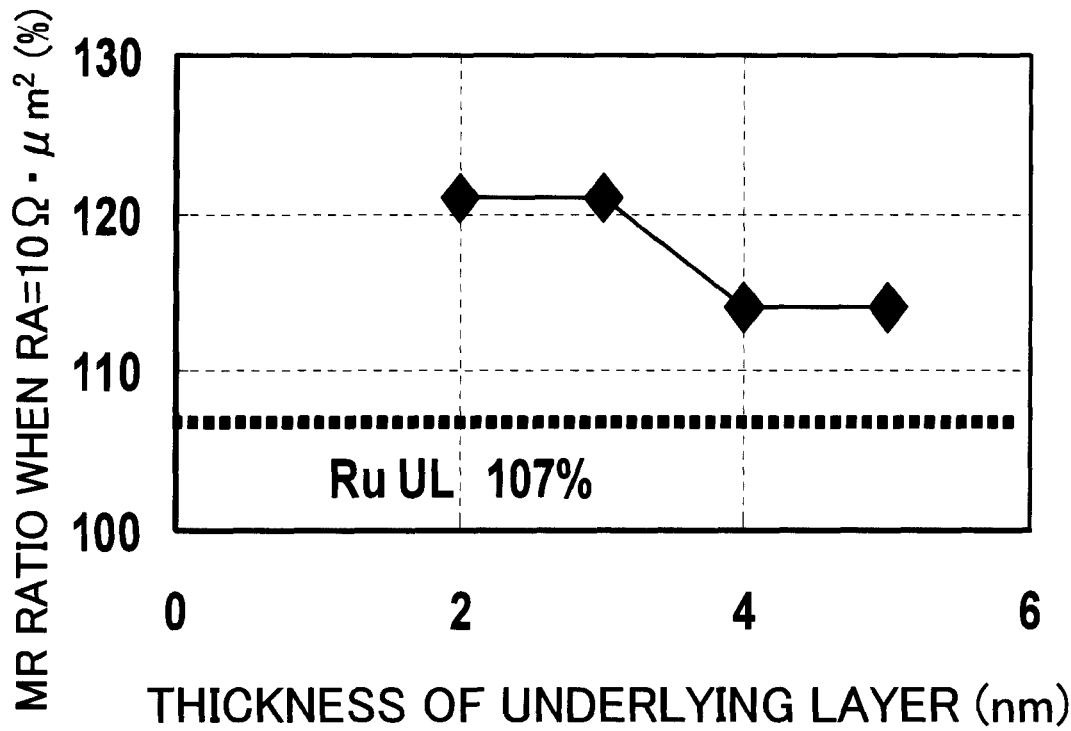
FIG. 4B is a graph showing a relation between an MR ratio of a sample having an area resistance of 10 $\Omega \cdot \mu m^2$ and a thickness of an underlying layer.

FIG. 4B shows a relation between an MR ratio with the area resistance RA being set to 10 $\Omega \cdot \mu m^2$ and a thickness of the underlying layer 2. The abscissa represents a thickness of the underlying layer 2 in the unit of "nm", and the ordinate represents an MR ratio in the unit of "%". For the purposes of comparison, an MR ratio of the sample using a Ru layer of 2 nm in thickness as the underlying layer 2 is indicated by a broken line. It can be understood that an MR ratio of each of the samples having thicknesses of the underlying layers 2 of particularly 2 and 3 nm is relatively high.

Figure 5:
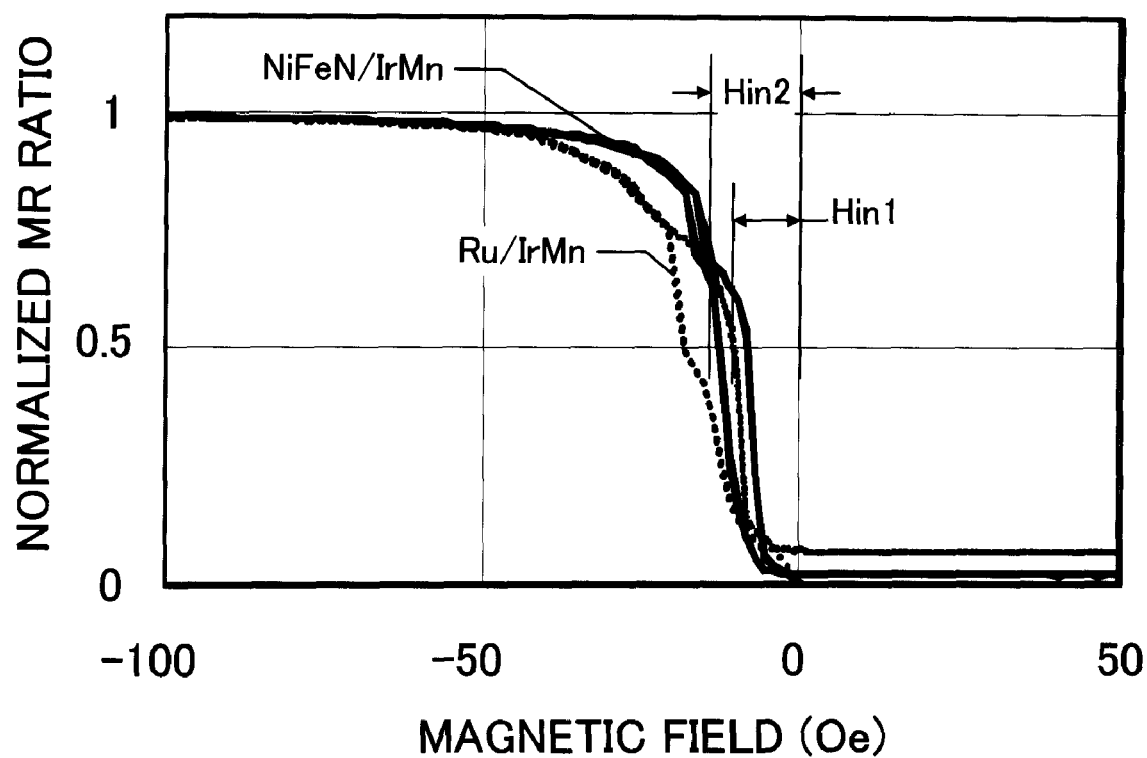
FIG. 5 is a graph showing hysteresis loops of a normalized MR ratio obtained by changing an external magnetic field applied to samples using a NiFeN layer and a Ru layer as the underlying layer of a pinning layer of IrMn.

FIG. 5 shows a relation between a normalized MR ratio (MR ratio=(R−Rmin)/Rmin) where R is an electric resistance and Rmin is the lowest electric resistance) and an external magnetic field, under the condition of changing the external magnetic field applied to the samples having the lamination structure shown in FIG. 1. An area resistance of the samples is 2 $\Omega \cdot \mu m^2$. For the purposes of comparison, a hysteresis loop of the sample using the Ru underlying layer 2 is indicated by a broken line. The abscissa represents an external magnetic field in the unit of "Oe", and the ordinate represents a normalized MR ratio with the highest MR ratio being set to 1. A shift amount of a magnetic field from the position at a magnetic field of 0 to a center between two points where the hysteresis loop crosses the line of the normalized MR ratio of 0.5 corresponds to an interlayer-coupling magnetic field Hin applied to the free layer 8 by the reference layer 4c.

It can be seen that an interlayer-coupling magnetic field Hin1 of the sample using the NiFeN underlying layer 2 is weaker than an interlayer-coupling magnetic field Hin2 of the sample using the Ru underlying layer 2. It can be considered that the reason why the interlayer-coupling magnetic field becomes weak if NiFeN is used for the underlying layer 2 may be improvement in flatness of the surface of the reference layer 4c.

Next, with reference to FIGS. 6A and 6B, the second embodiment will be described. In the first embodiment, the reference layer 4c as the underlying layer of the tunneling barrier layer 7 is made of CoFeB. Boron (B) is contained in the reference layer 4c to make the reference layer 4c be an amorphous phase and improve crystallinity of the tunneling barrier layer 7 of MgO formed on the reference layer 4c. In the second embodiment, although a reference layer 4c of a single layer is used in place of the synthetic ferri-pinned layer 4, this reference layer 4c is made of CoFe.

Figure 6A:
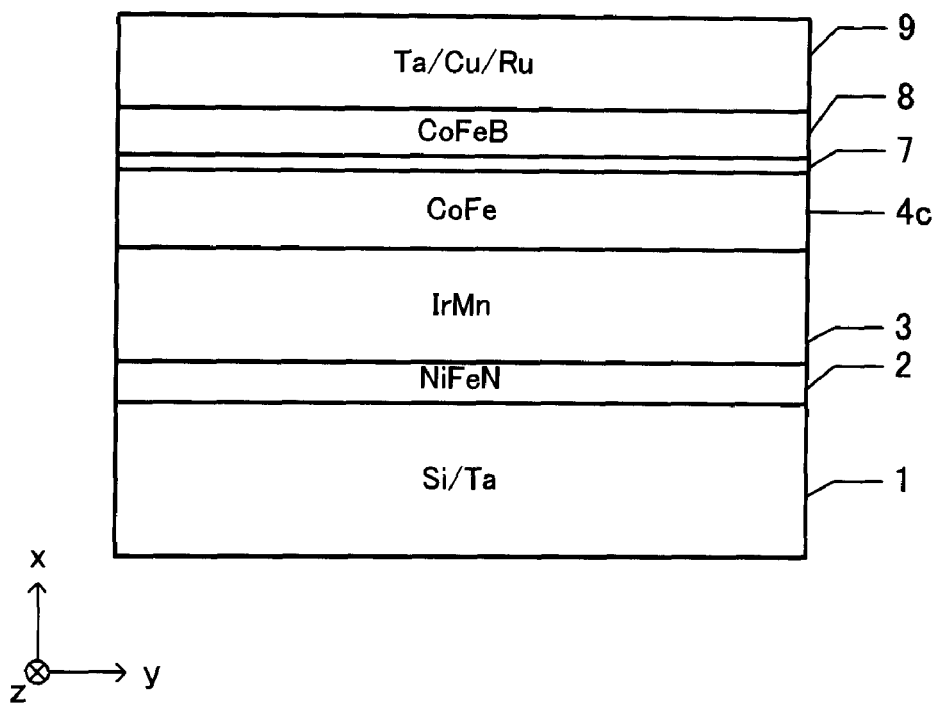
FIG. 6A is a cross sectional view of a TMR device using CoFe for a pinned structure according to a second embodiment.

FIG. 6A is a cross sectional view of a magnetoresistance effect device according to the second embodiment. Formed on a support substrate 1 are an underlying layer 2, a pinning layer 3, a reference layer 4c, a tunneling barrier layer 7, a free layer 8 and a cap layer 9 laminated in this order. The support substrate 1 has a structure that a Ta layer having a thickness of 3 nm is formed on a silicon substrate whose surface is etched to be planarized. The reference layer 4c is made of CoFe and has a thickness of 2.0 nm. The cap layer 9 has a three-layer structure that a Ta layer having a thickness of 5 nm, a Cu layer having a thickness of 10 nm and an Ru layer having a thickness of 10 nm are stacked in this order. The underlying layer 2, pinning layer 3, tunneling barrier layer 7 and free layer 8 each have the same structure as that of a corresponding layer of the magnetoresistance effect device shown in FIG. 1.

For the purposes of comparison, a sample was formed having the reference layer 4c of a two-layer structure that a CoFe layer having a thickness of 1.7 nm and a CoFeB layer having a thickness of 2.0 nm are stacked in this order. CoFe is crystalline and CoFeB is amorphous.

Figure 6B:
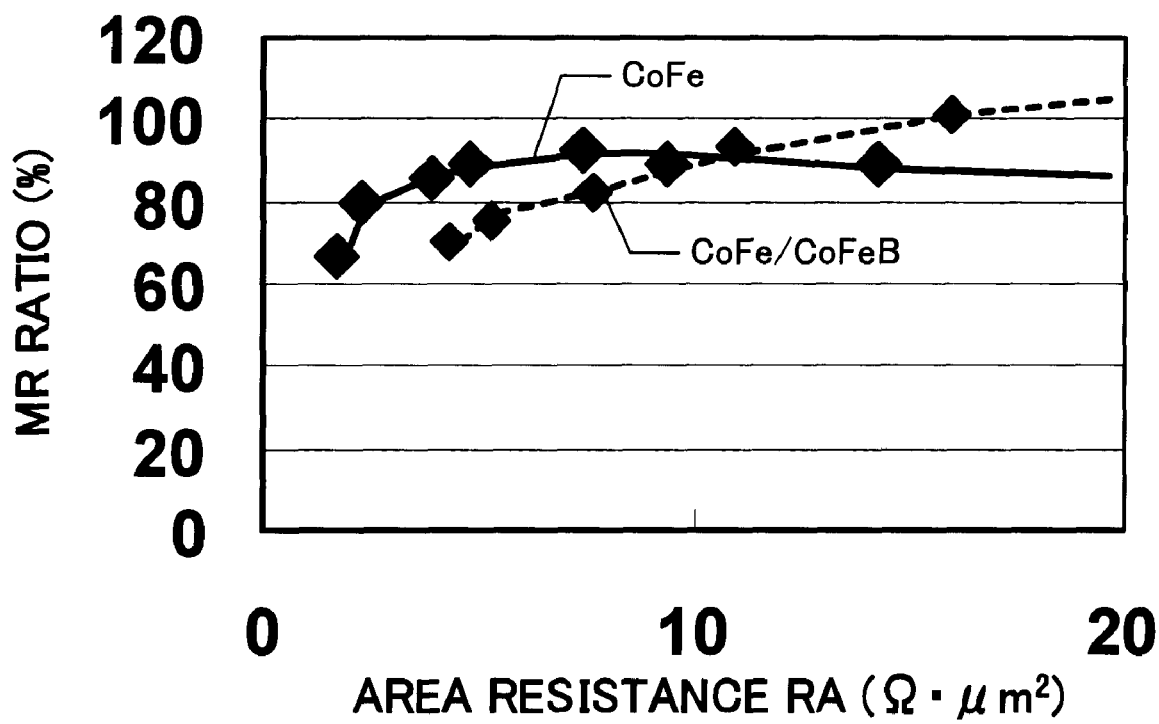
FIG. 6B is a graph showing a relation between an MR ratio and an area resistance RA of the TMR device of the second embodiment and a TMR device using CoFe for a pinned structure.

FIG. 6B shows a relation between an area resistance RA and an MR ratio. The abscissa represents an area resistance RA in the unit of "$\Omega \cdot \mu m^2$", and the ordinate represents an MR ratio in the unit of "%". If the area resistance RA is about 10 $\Omega \cdot \mu m^2$ or higher, i.e., if the tunneling barrier layer 7 is relatively thick, the sample using the amorphous CoFeB layer as the underlying layer of the tunneling barrier layer 7 has a higher MR ratio. On the other hand, if the area resistance RA is about 10 $\Omega \cdot \mu m^2$ or lower, i.e., if the tunneling barrier layer 7 is relatively thin, the sample using the crystalline CoFe layer as the underlying layer of the tunneling barrier layer 7 has a higher MR ratio. These experiment results will be studied in the following.

Good crystallinity of the (2 0 0) oriented underlying layer 2 is inherited to the pinning layer 3 and to the CoFe layer on the pinning layer 3. When the CoFeB layer is inserted as the underlying layer of the tunneling barrier layer 7 of MgO, since the CoFeB layer is amorphous, crystallinity of the underlying layer 2 will not be inherited to the tunneling barrier layer 7 of MgO. Therefore, crystallinity of the lower layer portion of the tunneling barrier layer 7 formed at the initial growth stage is bad. It can be considered, however, that as a film thickness becomes thick, crystallinity is improved and good (2 0 0) orientation is obtained.

On the other hand, when the reference layer 4c is made of CoFe, good crystallinity of the (2 0 0) oriented underlying layer 2 is inherited so that the pinning layer 3 has also good (2 0 0) orientation. This orientation is inherited via the reference layer 4c to the tunneling barrier layer 7. Therefore, the (2 0 0) oriented MgO film of high crystallinity can be obtained at the initial growth stage. It can be considered, however, that as a film thickness becomes thick, strain that arises from lattice mismatch between CoFe and MgO is generated, and crystallinity is degraded.

As understood from this evaluation result, when the tunneling barrier layer is made thin to set the area resistance RA to 10 $\Omega \cdot \mu m^2$, it is preferable that crystallinity of the underlying layer 2 is inherited to the tunneling barrier layer 7, without the amorphous layer between the underlying layer 2 and tunneling barrier layer 7.

Although the reference layer 4c consisting of a single layer is disposed between the pinning layer 3 and tunneling barrier layer 7 as shown in FIG. 6A, the synthetic ferri-pinned layer may be adopted in place of the reference layer 4c consisting of a single layer as shown in FIG. 1. In this case, if the pinned layer 4a and reference layer 4c are made of CoFe, crystallinity of the underlying layer 2 can be inherited to the tunneling barrier layer 7.

Although a so-called bottom type TMR device is shown in FIG. 6A in which the pinning layer 3 and reference layer 4c are disposed closer to the substrate than the free layer 8. A top type TMR device having a reversed position relation is expected to have advantages as described above.

Figure 7:
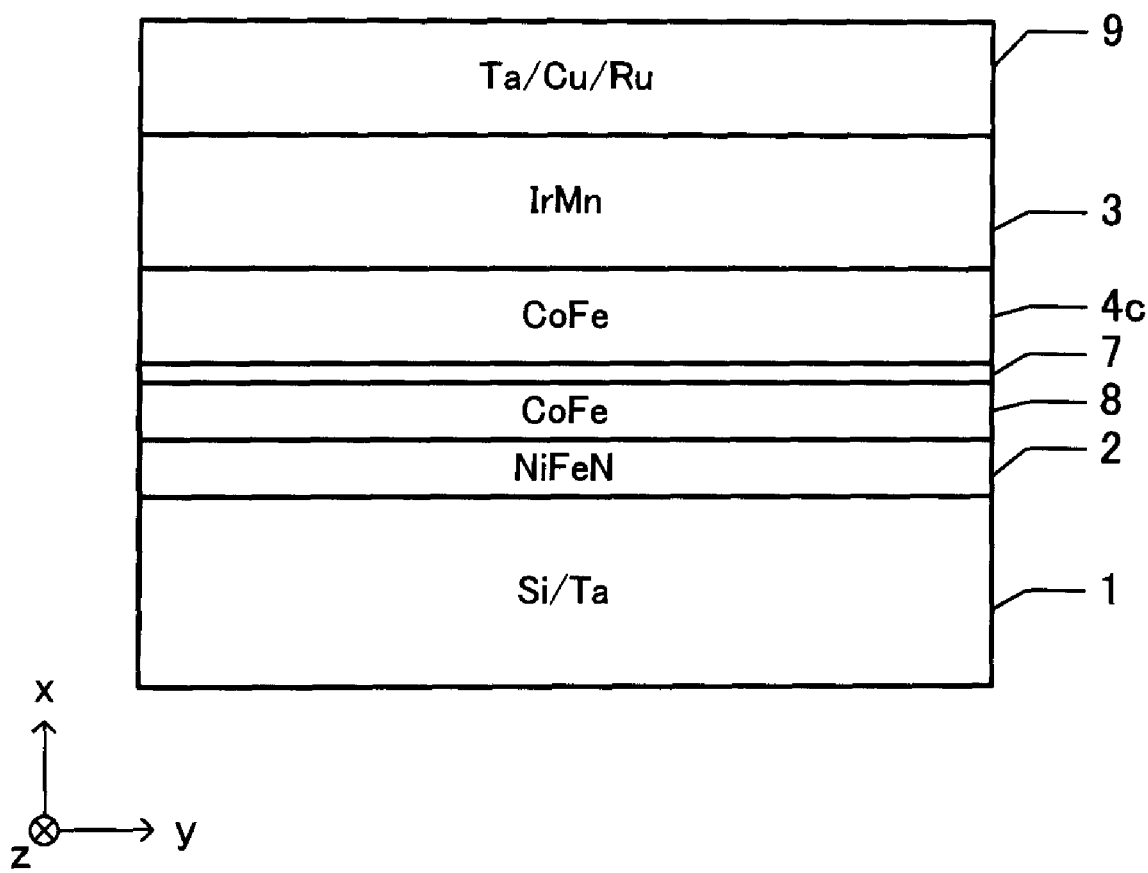
FIG. 7 is a cross sectional view of a top type TMR device.

FIG. 7 is a cross sectional view of a top type TMR device. An underlying layer 2 is formed on a support substrate 1. On the underlying layer 2, a free layer 8, a tunneling barrier layer 7, a reference layer 4c, a pinning layer 3 and a cap layer 9 are laminated in this order. The free layer 8 is made of crystalline CoFe. Therefore, crystallinity of the underlying layer 2 of NiFeN is inherited via the free layer 8 to the tunneling barrier layer 7 of MgO. The (2 0 0) oriented MgO film of high crystallinity can therefore be obtained even if the tunneling barrier layer 7 is made thin.

By replacing the tunneling barrier layer of the TMR device of the first and second embodiments with a nonmagnetic metal layer such as Cu, a current-in-plane (CIP) type spin valve film and a current-perpendicular-to-the-plane (CPP) type spin valve film can be formed. Also in this case, there is the advantage that a flatness of the surface of the pinning layer 3 can be improved.

In the first and second embodiments, although IrMn is used for the pinning layer 3, other antiferromagnetic materials having Ir and Mn in major proportions are expected to provide the same advantageous effects.

Figure 8A:
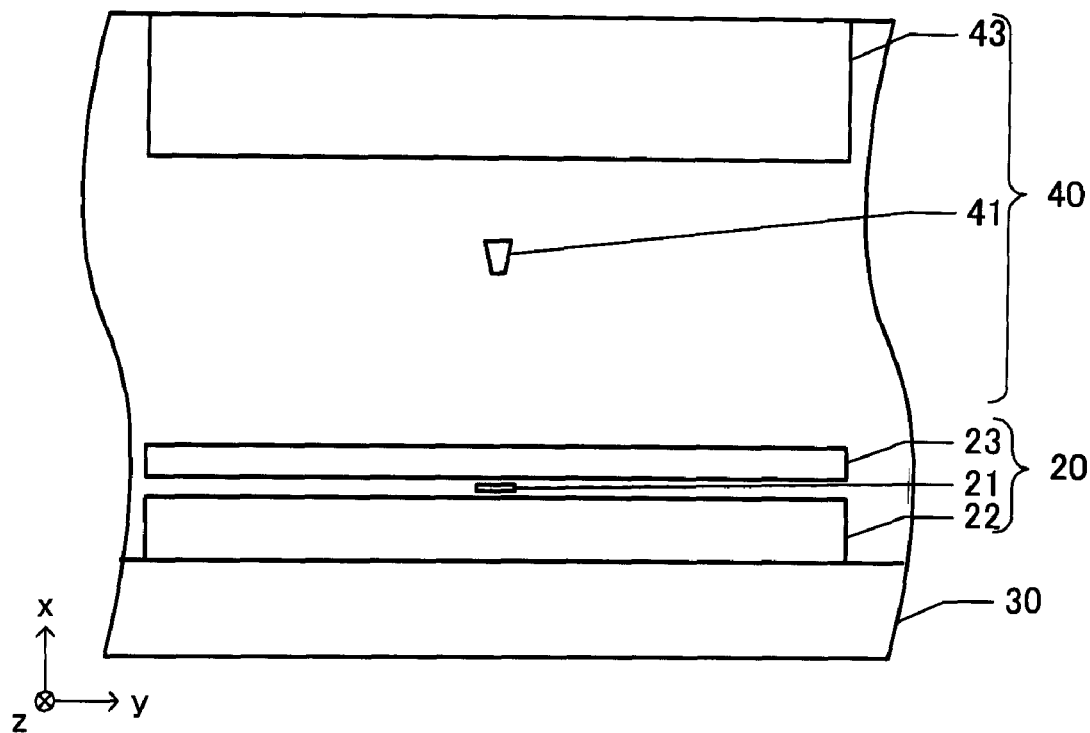
FIG. 8A is a front view of a face opposed to a magnetic medium of a magnetic head according to a third embodiment.
Figure 8B:
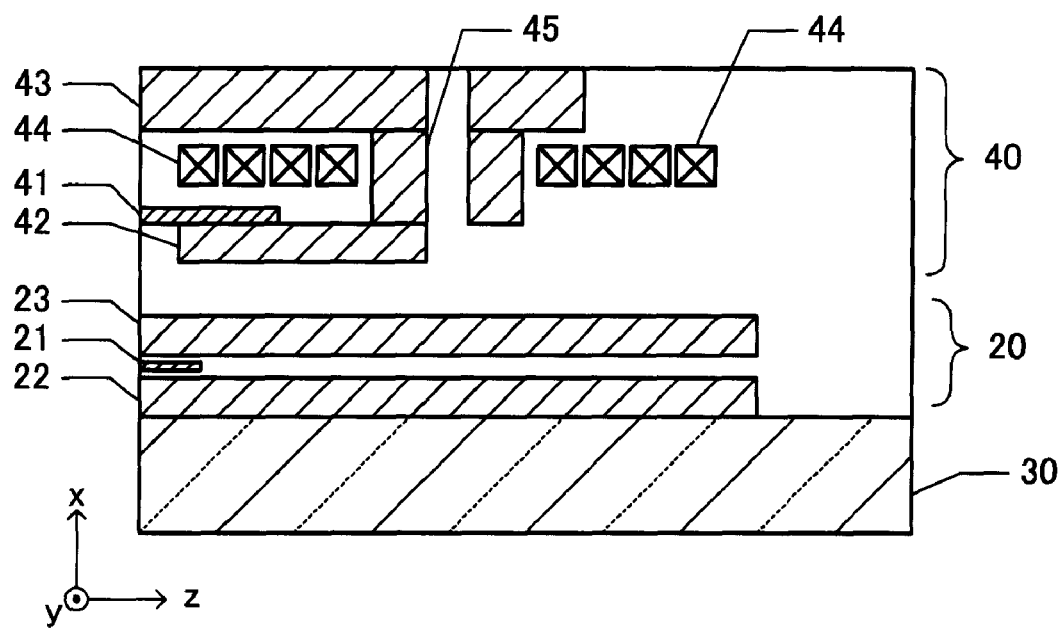
FIG. 8B is a cross sectional view of the magnetic head.

FIG. 8A is a front view of a face opposed to a recording medium of a magnetic head according to the third embodiment. An xyz orthogonal coordinate system is defined in such a manner that an xy plane is defined on the face opposed to a recording medium, x-axis is parallel to a trailing direction, y-axis is parallel to a track width direction, z-axis is perpendicular to the face opposed to a recording medium. FIG. 8B is a cross sectional view parallel to the zx plane of the magnetic head.

On a substrate 30, a reading element portion 20 and a recording element portion 40 are laminated in this order. The reading element portion 20 includes a lower magnetic shielding layer 22, a magnetoresistance effect film 21 and an upper magnetic shielding layer 23. The recording element portion 40 includes a main magnetic pole 41, a main magnetic pole auxiliary layer 42, an auxiliary magnetic pole 43 and a coupling portion 45. The main magnetic pole 41, main magnetic pole auxiliary layer 42, auxiliary magnetic pole 43 and coupling portion 45 constitute a part of a magnetic path of magnetic fluxes generated during magnetic recording. A recording coil 44 is disposed so as to have a linkage with the magnetic path. The recording element portion 40 can be manufactured by well-known methods.

Next, with reference to FIGS. 9A to 9C, description will be made on a method of manufacturing the reading element portion 20.

Figure 9A:
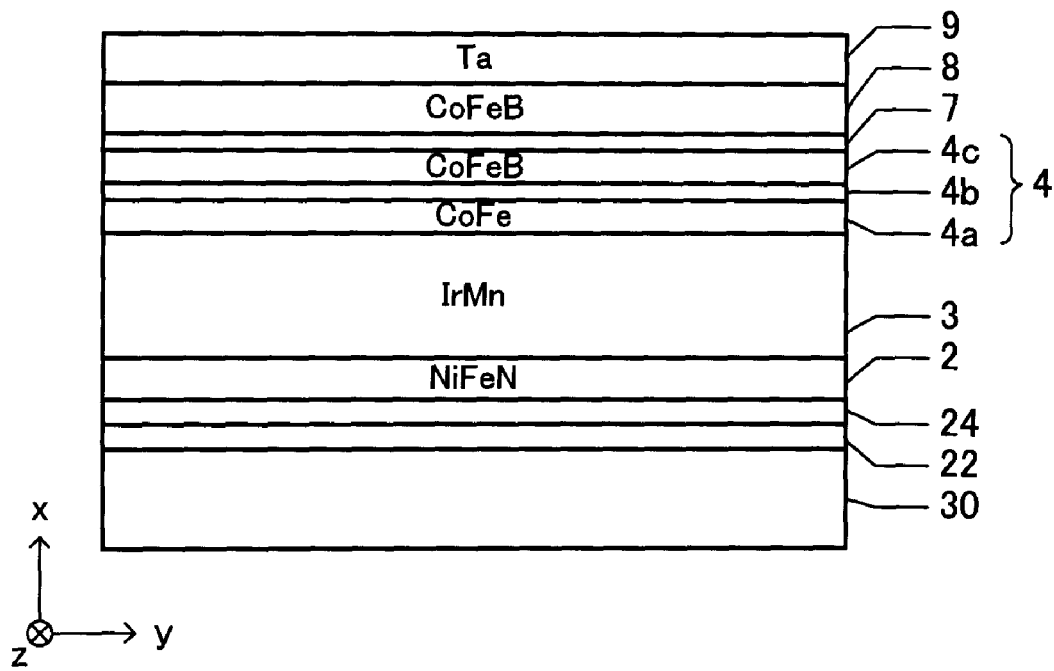
FIGS. 9A and 9B are cross sectional views illustrating a reading element portion of the magnetic head during manufacture of the third embodiment.

As shown in FIG. 9A, on a nonmagnetic substrate made of Al$_2$O$_3$—TiC or the like, an Al$_2$O$_3$ film is formed to prepare a support substrate 30. On the support substrate 30, a lower magnetic shielding layer 22 is formed by sputtering. The lower magnetic shielding layer 22 is made of high magnetic permeability material such as NiFe, and has a thickness of 2 to 3 μm, for example. On the lower magnetic shielding layer 22, an auxiliary underlying layer 24 made of Ta is formed by sputtering.

Layers from an underlying layer 2 to a free layer 8 are formed on the auxiliary underlying layer 24. This lamination structure is the same as that of the magnetoresistance effect device of the first or second embodiment. A total thickness of the auxiliary underlying layer 24 and underlying layer 22 is, for example, 5 nm. The synthetic ferri-pinned layer 4 may be constituted of three layers including a CoFe pinned layer 4a having a thickness of 1.5 nm, a nonmagnetic intermediate layer 4b of Ru80Rh20 atomic % having a thickness of 0.5 nm and a reference layer 4c of CoFeB having a thickness of 2.5 nm. In this case, a Rh content of the nonmagnetic intermediate layer 4b is preferably set in a range between 5 atomic % and 40 atomic %, and more preferably 20 atomic % and 30 atomic %. A thickness of the nonmagnetic intermediate layer 4b is preferably set in a rage between 0.3 nm and 0.7 nm, and more preferably 0.4 nm and 0.7 nm. The nonmagnetic intermediate layer 4b may be made of Ru.

A cap layer 9 is formed on the free layer 8. As the cap layer 9, for example a Ta layer having a thickness of at least 3 nm is used. A Ru layer or a Ti layer may be used in place of the Ta layer. A lamination structure of a Ta layer and a Ru layer may also be used.

Figure 9B:
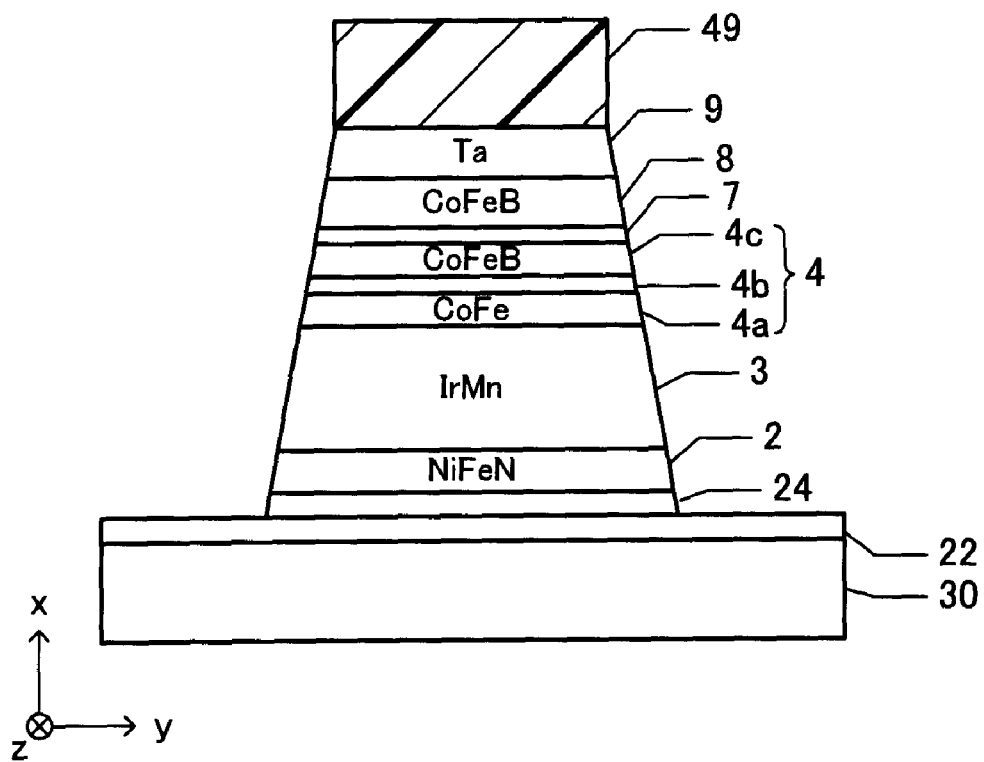
Figure 9C:
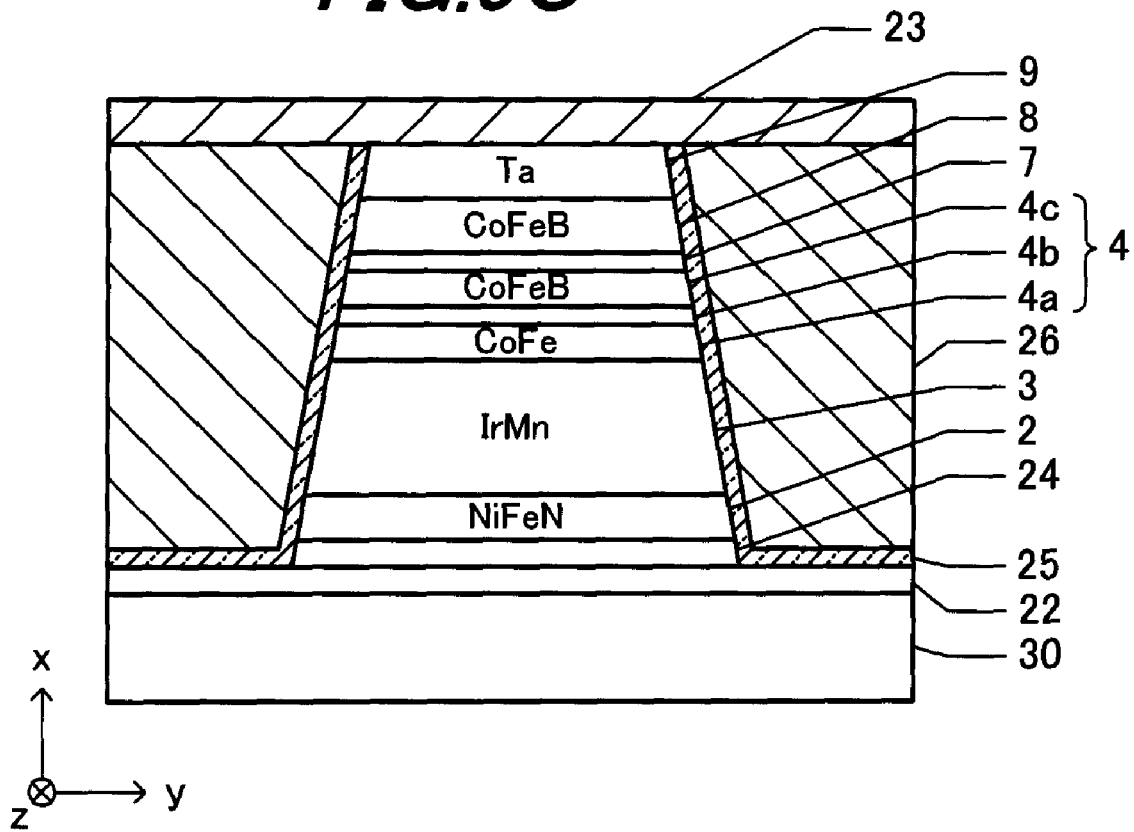
FIG. 9C is a cross sectional view of the reading element portion of the magnetic head of the third embodiment.

As shown in FIG. 9B, a partial area of the cap layer 9 is covered with a resist pattern 49 by ordinary photolithography. By using the resist pattern 49 as an etching mask, layers from the cap layer 9 to auxiliary underlying layer 24 are patterned by ion milling. The lower magnetic shielding layer 22 is exposed in an area not covered with the resist pattern 49.

Processes up to the structure shown in FIG. 9C will be described. In the state that the resist pattern 49 shown in FIG. 9B remains, an insulating film 25 of Al$_2$O$_3$ having a thickness of 3 to 10 nm, for example, is deposited on the whole surface by sputtering. A magnetic domain control film 26 of CoCrPt or the like is deposited on the insulating film 25 by sputtering. After the magnetic domain control film 26 is deposited, the resist pattern 49 (FIG. 9B) together with the insulating film 25 and magnetic domain control film 26 deposited on the resist pattern are removed. The magnetic domain control film 26 therefore remains on both sides (positive and negative sides of the y-axis direction) of the lamination structure including layers between the auxiliary underlying layer 24 and the cap layer 9.

The surface of the magnetic domain control film 26 is planarized by chemical mechanical polishing (CMP). Thereafter, an upper magnetic shielding layer 23 made of NiFe or the like having a thickness of 2 to 3 μm is deposited on the cap layer 9 and magnetic domain control film 26 by sputtering. With these processes, the reading element portion 20 shown in FIGS. 8A and 8B is completed.

The magnetic domain control film 26 is subjected to heat treatment in a magnetic field to bias the magnetization direction of the free layer 8 in the y-axis direction. The magnetization directions of the pinned layer 4a and reference layer 4c are fixed to the z-axis direction by exchange-coupling with the pinning layer 3.

The magnetization direction of the free layer 8 changes depending upon a magnetic field corresponding to data recorded in a magnetic recording medium. Therefore, the TMR device having the lamination structure including layers between the auxiliary underlying layer 24 and the cap layer 9 changes its electric resistance. By electrically detecting a change in the resistance, the data recorded in the magnetic recording medium can be read.

Figure 10:
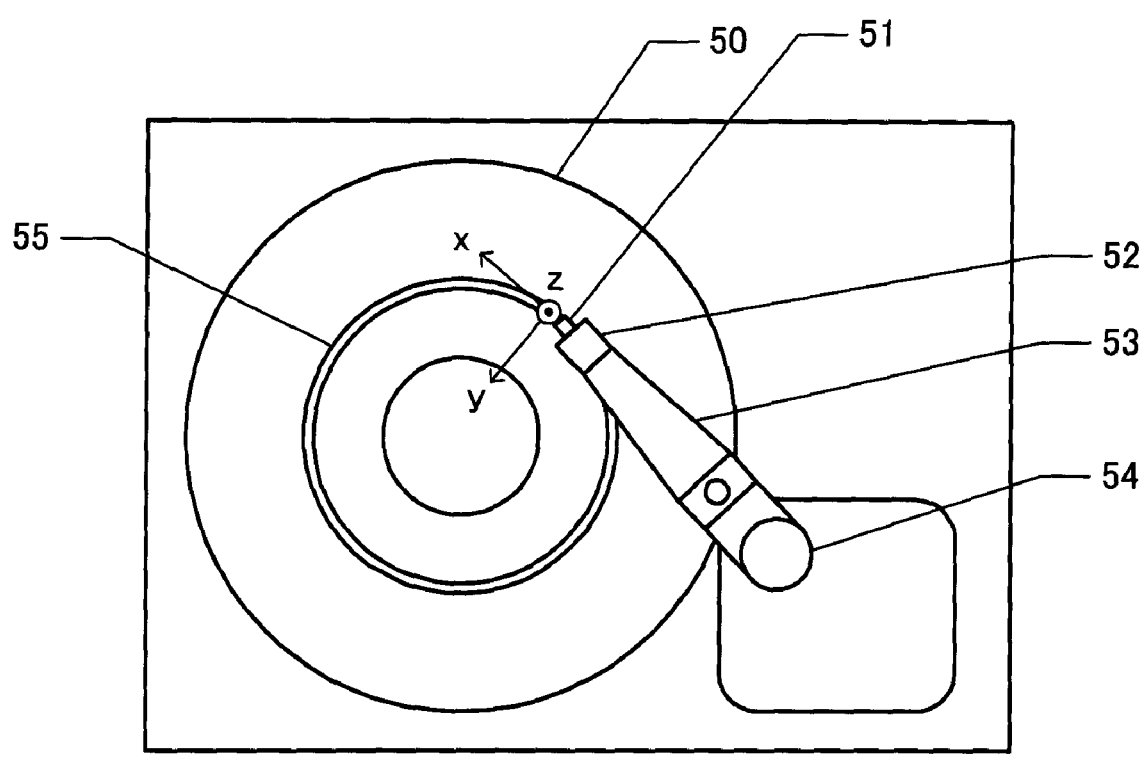
FIG. 10 is a schematic diagram showing a hard disk drive using the magnetic head of the third embodiment.

FIG. 10 is a schematic diagram of a magnetic disc drive using the magnetic head of the third embodiment. A slider 52 is mounted by a support member called gimbals on a distal end of a suspension arm 53 supported by a rotary actuator 54. A magnetic head 51 is mounted on the end of the slider 52. The magnetic head of the third embodiment is used as the magnetic head 51.

The magnetic head 51 hovers at a small height from the surface of a magnetic disc 50. A number of concentric tracks 55 are defined on the surface of the magnetic disc 50. By driving the rotary actuator 54 and pivoting the suspension arm 53, the magnetic head 51 can be moved to a different position in the radial direction of the magnetic disc 50.

By using the TMR device or spin valve film of the first or second embodiment for the magnetic head, it is possible to prevent deterioration of the device characteristics to be caused by a poor flatness of the surface of a pinning layer.

The fourth embodiment will be described with reference to FIGS. 11A and 11B. Although the TMR device is applied to the magnetic head in the third embodiment, the TMR device is applied to MRAM in the fourth embodiment.

Figure 11A:
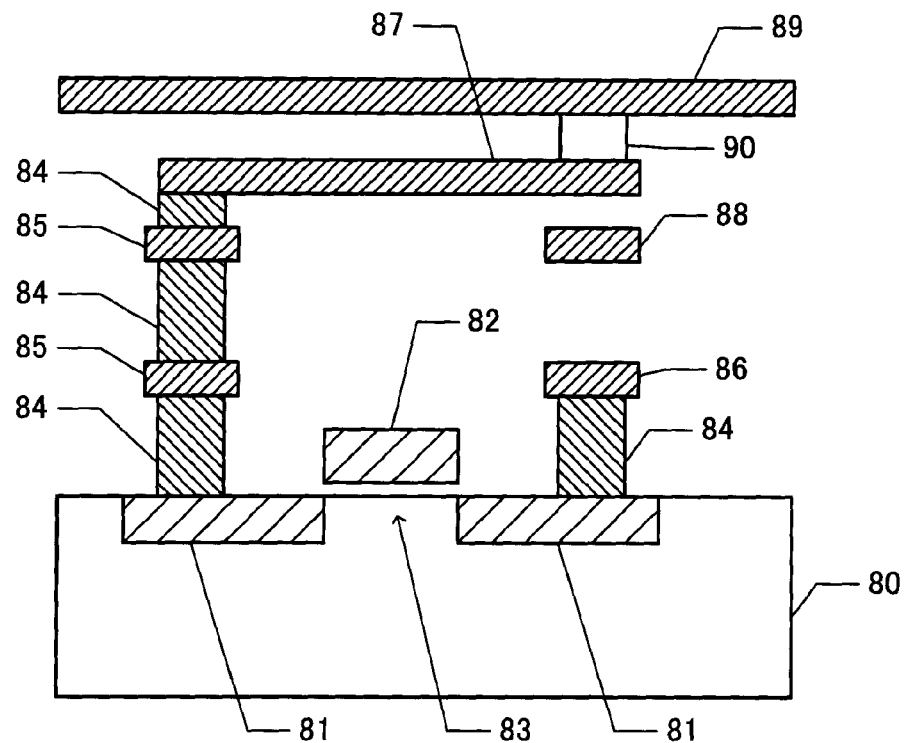
FIG. 11A is a cross sectional view of an MRAM according to a fourth embodiment.

FIG. 11A is a cross sectional view of an MRAM of the fourth embodiment. Disposed on a silicon substrate 80 are read word lines 82, MOS transistors 83, write word lines 88, bit lines 89 and TMR devices 90. The read word lines 82 and write word lines 88 are in one-to-one correspondence, and extend in a first direction (a direction perpendicular to the drawing sheet of FIG. 11A). The bit lines 89 extend in a second direction (a horizontal direction in FIG. 11A) crossing the first direction.

The MOS transistor 83 is disposed at a cross point between the read word line 82 and bit line 89. The read word line 82 also functions as the gate electrode of the MOS transistor 83. Namely, the conductive state of the MOS transistor 83 is controlled by a voltage applied to the read word line 82.

The TMR device 90 is disposed at each cross point between the write word line 88 and bit line 89. The TMR device 90 has the same lamination structure as that of the TMR device of the first embodiment shown in FIG. 1 or the second embodiment shown in FIG. 6A. A magnetization direction of the free layer of the TMR device 90 changes being affected by a magnetic field generated by current flowing through the write word line 88 and bit line 89. The underlying layer (underlying layer 2 shown in FIG. 1) of the TMR device 90 is connected to one impurity diffusion region 81 of the MOS transistor 83 via a wiring 87 and a plurality of plugs 84 and isolated wirings 85 formed through multilayer wiring layers. The cap layer (cap layer 9 shown in FIG. 1) of the TMR device 90 is connected to the bit line 89. Namely, the wiring 87 and bit line 89 function as electrodes for applying a sense current to the TMR device 90 in a thickness direction.

The other impurity diffusion region 81 of the MOS transistor 83 is connected to a ground wiring 86 via a plug 84.

Figure 11B:
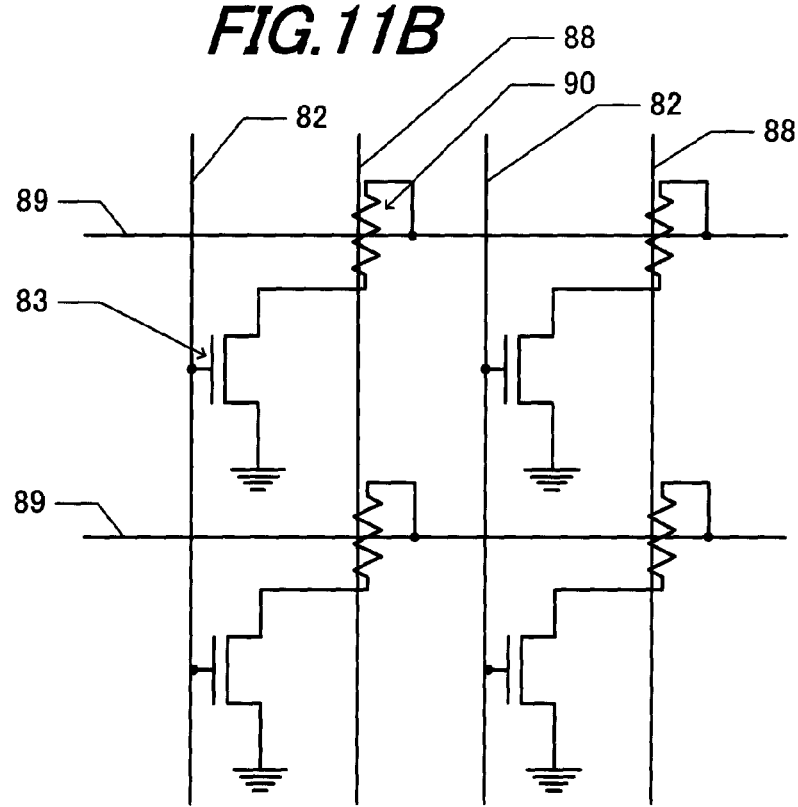
FIG. 11B is an equivalent circuit of MRAM.
Figure 12:
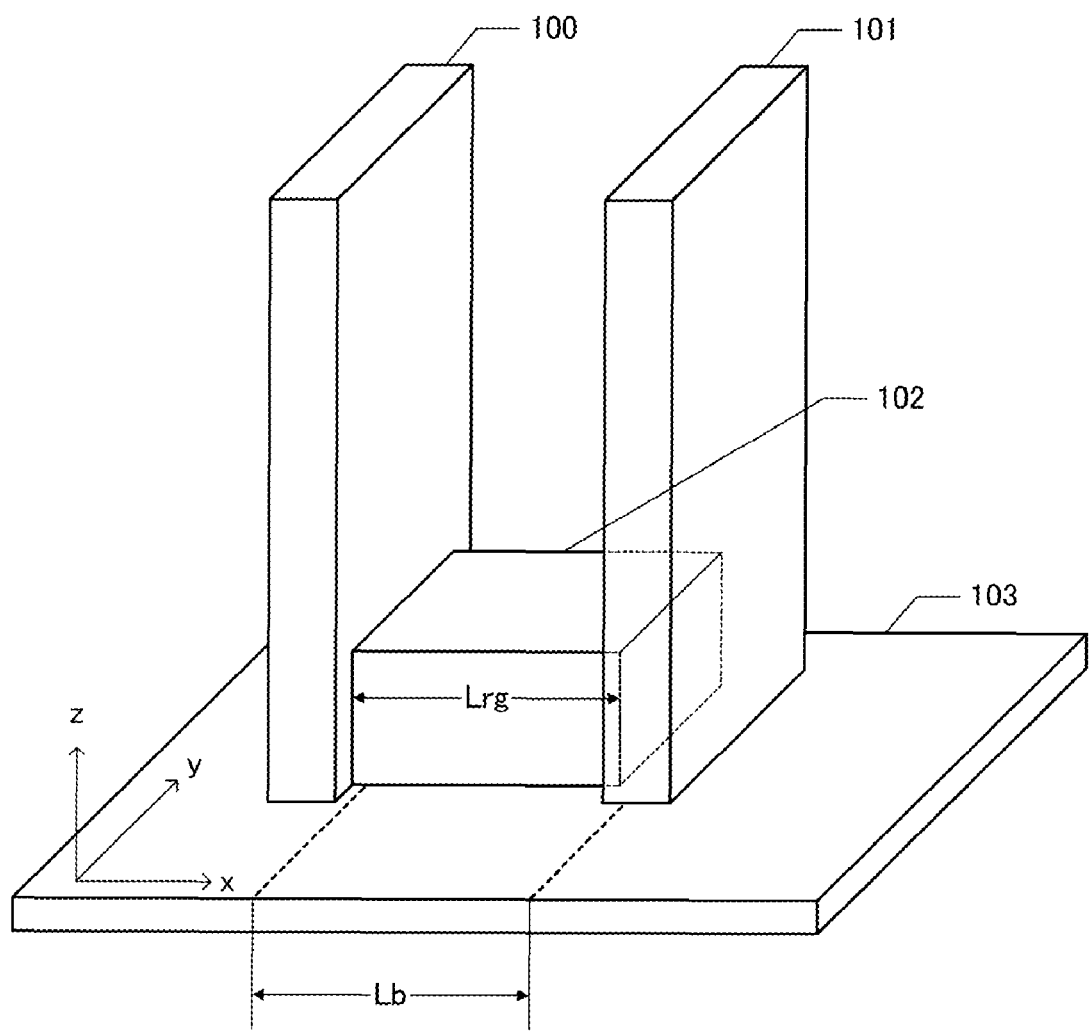
FIG. 12 is a perspective view of a magnetic head and a magnetic recording medium.

FIG. 11B is an equivalent circuit diagram of MRAM of the fourth embodiment. A plurality of read word lines 82 extend in the first direction (vertical direction in FIG. 11B). The write word line 88 extending in the first direction is disposed in correspondence with the read word line 82. A plurality of bit lines 89 extend in the second direction (horizontal direction in FIG. 11B) crossing the first direction.

The TMR device 90 is disposed at a cross point between the bit line 89 and write word line 88. The MOS transistor 83 is disposed at a cross point between the read word line 82 and bit line 89. One terminal of the TMR device is connected to a corresponding bit line 89, and the other terminal thereof is connected to one terminal of a corresponding MOS transistor 83. The other terminal of the MOS transistor 83 is grounded. The gate electrode of the MOS transistor 83 is connected to a corresponding read word line 82.

The TMR device 90 is made to have the same lamination structure as that of the TMR device of the first or second embodiment, so that it is possible to prevent deterioration of the device characteristics to be caused by a degraded flatness of the surface of a pinning layer.

The present invention has been described in connection with the preferred embodiments. The invention is not limited only to the above embodiments. It will be apparent to those skilled in the art that other various modifications, improvements, combinations, and the like can be made.

What are claimed are:

1. A magnetoresistance effect device comprising:
   an underlying layer made of NiFeN and disposed over a principal surface of a substrate;
   a pinning layer made of antiferromagnetic material containing Ir and Mn and disposed on the underlying layer;
   a reference layer disposed over the pinning layer and made of ferromagnetic material whose magnetization direction is fixed through exchange-coupling with the pinning layer directly or via another ferromagnetic material layer;
   a nonmagnetic layer made of nonmagnetic material and disposed over the reference layer; and
   a free layer disposed over the nonmagnetic layer and made of ferromagnetic material whose magnetization direction changes in dependence upon an external magnetic field.

2. The magnetoresistance effect device according to claim 1, wherein the pinning layer has a crystalline orientation that a (2 0 0) crystalline plane of the pinning layer is parallel to the principal surface of the substrate.

3. The magnetoresistance effect device according to claim 1, wherein a thickness of the underlying layer is 2 nm or thicker.

4. The magnetoresistance effect device according to claim 1, wherein a thickness of the underlying layer is 4 nm or thinner.

5. The magnetoresistance effect device according to claim 1, wherein the nonmagnetic layer is made of insulating material and has a thickness allowing a tunneling current to flow in a thickness direction.

6. The magnetoresistance effect device according to claim 5, wherein the nonmagnetic layer is made of MgO.

7. The magnetoresistance effect device according to claim 6, wherein a crystalline orientation of the underlying layer is inherited up to the nonmagnetic layer via the pinning layer and the reference layer.

8. The magnetoresistance effect device according to claim 1, further comprising:
   a pinned layer disposed between the pinning layer and the reference layer and made of ferromagnetic material; and
   an intermediate layer disposed between the pinned layer and the reference layer and made of nonmagnetic material,
   wherein:
   a magnetization direction of the pinned layer is fixed through exchange-coupling with the pinning layer; and
   the pinned layer and the reference layer are exchange-coupled with each other via the intermediate layer in such a manner that magnetization directions of the pinned layer and the reference layer are antiparallel to each other.

9. The magnetoresistance effect device according to claim 1, wherein nitrogen in the underlying layer is distributed from a bottom surface of the underlying layer to a top surface of the underlying layer.

10. A magnetic lamination structural body comprising:
    an underlying layer made of NiFeN and disposed over a principal surface of a substrate;
    a pinning layer made of antiferromagnetic material containing Ir and Mn and disposed on the underlying layer; and
    a pinned layer disposed over the pinning layer and made of ferromagnetic material whose magnetization direction is fixed through exchange-coupling with the pinning layer.

11. The magnetic lamination structural body according to claim 10, wherein NiFeN of the underlying layer has a crystalline orientation that a (2 0 0) crystalline plane of the underlying layer is parallel to the principal surface of the substrate.

12. The magnetic lamination structural body according to claim 10, wherein nitrogen in the underlying layer is distributed from a bottom surface of the underlying layer to a top surface of the underlying layer.

13. A magnetoresistance effect device comprising:
    an underlying layer made of NiFeN and disposed over a principal surface of a substrate;
    a free layer disposed over the underlying layer and made of ferromagnetic material whose magnetization direction changes in dependence upon an external magnetic field;
    a tunneling barrier layer disposed over the free layer and made of MgO; and
    a reference layer disposed over the tunneling barrier layer and made of ferromagnetic material whose magnetization direction is fixed.

14. The magnetoresistance effect device according to claim 13, wherein the free layer is made of CoFe and does not contain B.

15. The magnetoresistance effect device according to claim 13, wherein crystallinity of the underlying layer is inherited up to the tunneling barrier layer via the free layer.

* * * * *